(12) United States Patent
Schlenker

(10) Patent No.: US 7,557,502 B2
(45) Date of Patent: Jul. 7, 2009

(54) ELECTROLUMINESCENT DISPLAY WITH GAS-TIGHT ENCLOSURE

(75) Inventor: Tilman Ulrich Schlenker, Aachen (DE)

(73) Assignee: TPO Displays Corp., Chu-Nan (TW)

( * ) Notice: Subject to any disclaimer, the term of this patent is extended or adjusted under 35 U.S.C. 154(b) by 261 days.

(21) Appl. No.: 10/492,663

(22) PCT Filed: Oct. 14, 2002

(86) PCT No.: PCT/IB02/04232

§ 371 (c)(1),
(2), (4) Date: Apr. 15, 2004

(87) PCT Pub. No.: WO03/034513

PCT Pub. Date: Apr. 24, 2003

(65) Prior Publication Data

US 2004/0251826 A1  Dec. 16, 2004

(30) Foreign Application Priority Data

Oct. 18, 2001  (EP)  ................................. 01203979

(51) Int. Cl.
*H01J 1/62* (2006.01)
(52) U.S. Cl. ........................ 313/512; 313/504
(58) Field of Classification Search ......... 313/511–512, 313/504
See application file for complete search history.

(56) References Cited

U.S. PATENT DOCUMENTS

| 5,585,695 | A |  | 12/1996 | Kitai |  |
|---|---|---|---|---|---|
| 5,638,469 | A | * | 6/1997 | Feldman et al. | 385/14 |
| 5,644,327 | A | * | 7/1997 | Onyskevych et al. | 345/80 |
| 5,693,170 | A | * | 12/1997 | Li | 156/299 |
| 5,703,394 | A | * | 12/1997 | Wei et al. | 257/433 |
| 5,814,935 | A | * | 9/1998 | Ujihara | 313/504 |
| 5,821,571 | A | * | 10/1998 | Lebby et al. | 257/98 |
| 6,195,142 | B1 | * | 2/2001 | Gyotoku et al. | 349/69 |
| 6,633,134 | B1 | * | 10/2003 | Kondo et al. | 315/169.3 |

FOREIGN PATENT DOCUMENTS

| EP | 0884782 |  | 12/1998 |
| JP | 9260544 |  | 10/1997 |
| JP | 11-233255 |  | 8/1999 |
| JP | 2001092381 | A * | 4/2001 |
| WO | WO 01/57938 |  | 8/2001 |

* cited by examiner

*Primary Examiner*—Toan Ton
*Assistant Examiner*—Hana A Sanei
(74) *Attorney, Agent, or Firm*—Liu & Liu

(57) ABSTRACT

An organic electroluminescent device (1) comprising an EL element (2) supported on a transparent substrate (6). A cover plate (7) of a ceramic or glass-ceramic material is provided which plate is sealed by metallic sealing means (10), to the transparent substrate, whereby a gas-tight enclosure is formed for the EL element. The cover plate supports a driver IC (15). The cover plate is provided with internal conductors (12a, 12b, 12c) which connect first contact pads (13a, 13b, 13c) connected to the EL element (2) and to second contact pads (14a, 14b, 14c) connected to the driver IC (15), at least one first contact pad and the second contact pad to which it is connected being non-aligned.

7 Claims, 3 Drawing Sheets

ELECTROLUMINESCENT DISPLAY WITH GAS-TIGHT ENCLOSURE

Figure 1:
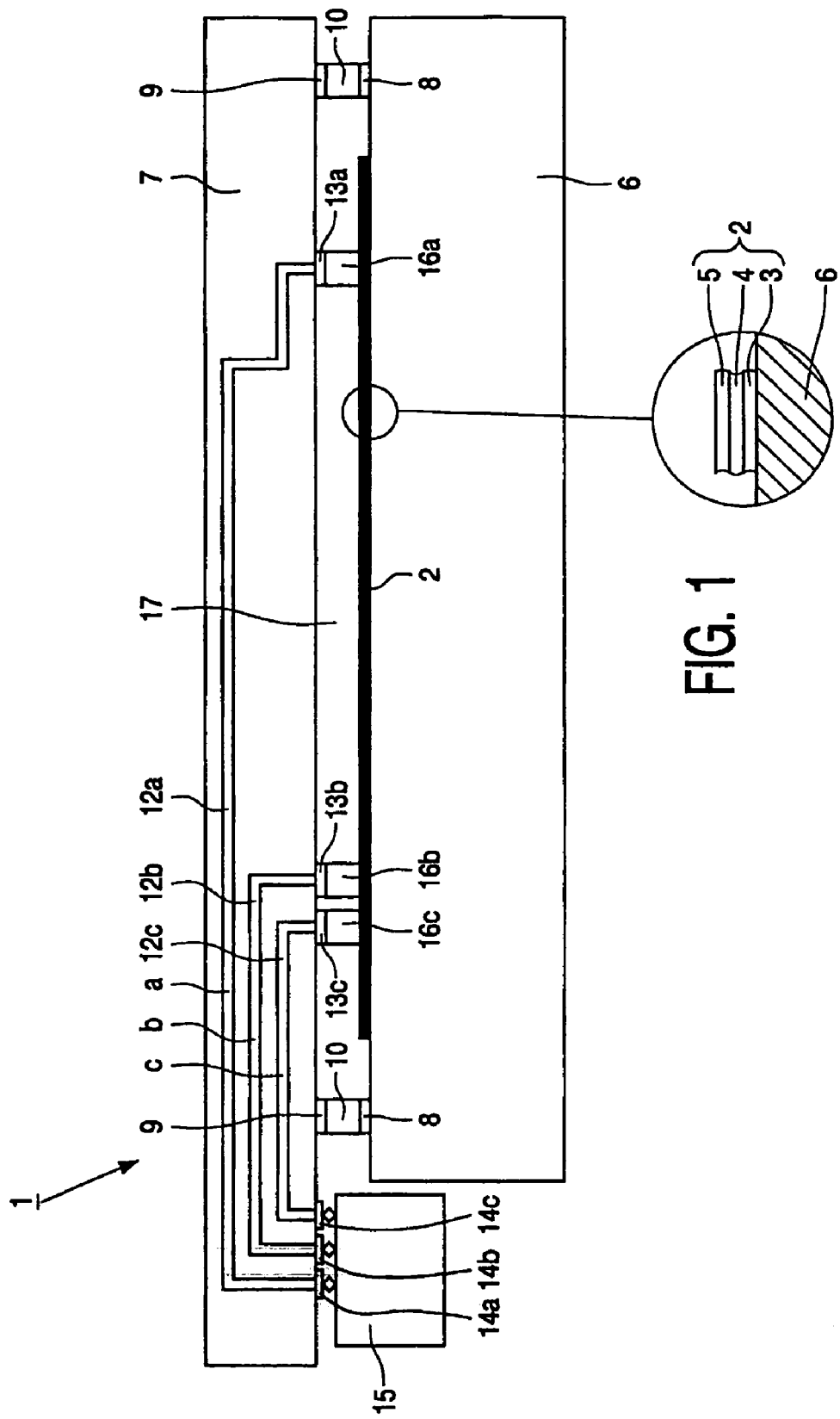

The invention relates to an organic electroluminescent device comprising a transparent substrate, a cover plate, provided with a first side facing the transparent substrate and a second side opposed to the first side, at least one electroluminescent element comprising an organic electroluminescent layer arranged between the transparent substrate and the cover plate, and an intermediate sealing means joining the transparent substrate and the cover plate. An organic electroluminescent device is a new flat emissive display that can be used in a large number of different applications such as mobile phones, organizers, computers and all other applications which are now served by LCDs with or without backlights or other flat display devices.

The device consists of a glass plate that is covered on one side with some optical foils and on the other side with a number of structured thin layers of electrodes such as the transparent ITO and various metals, for example, aluminum, barium, lithium or others. In-between these electrodes the light-emitting polymers are placed. This stack with a total thickness in the submicron range forms the active part of the device. As some of the layers in this stack are sensitive to oxygen or water, the active part of the device has to be sealed gas- and watertight either by a metal or glass lid or by thin or thick film layers. In the case of thin or thick film layers one has to make sure that first an insulating layer is provided on top of the electrodes to prevent short-circuits which could be caused by metal layers. Lids are glued to the device with an (electrically insulating) adhesive, providing a cavity which is filled with desiccants and/or oxygen absorbers.

To get a working display, electrical conductors have to connect the internal electrodes in the sealed area with the outer world. These conductors usually run on the glass surface and pass through the sealing line consisting of insulating glue or thin film layers. This sealing technique has two major disadvantages:

Glues such as epoxy resigns, hot-melt polymers, or other organic components always allow a slight water diffusion into the device, which requires the use of a "getter material" (desiccant) within the device.

The large number of electrodes issuing from the device lie next to one another, and the interconnection to a driver IC calls for an additional electrical connection device. This also applies for thin and thick film sealed devices.

It is therefore an object of the invention to provide an organic electroluminescent device of the kind mentioned in the opening paragraph, which is provided with a hermetically closed housing. This object is realized in that:

the cover plate being formed of a material selected from the group of glass-ceramic and ceramic materials;
a first conductive pattern formed on the first side of the cover plate and comprising first contact pads;
a second conductive pattern formed on one of the sides of the cover plate and comprising second contact pads; and
the first and the second conductive pattern being electrically interconnected through internal conductors extending inside the cover plate.

Due to the provision of the conductors through the cover plate, the sealing means can be chosen to be very thin and optimally closing the housing. The cover plate is particularly a High-Temperature Ceramic Cofiring (HTCC) or Low-Temperature Ceramic Cofiring (LTCC) substrate. LTCC is a multilayer co-fired glass-ceramic material with highly conductive conductors within the ceramic body. The LTCC material is absolutely gastight, comparable to metal or glass. Its conductors comprise for instance Cu or Ag. The thickness of the substrate depends on the number of layers and is typically 100 to 150 µm per layer. The fired substrate is flat with a pitch of the electrodes from a standard of 100 µm currently down to 30 µm. The expansion coefficient of the material can be adapted to fit to the transparent substrate. Since the cover plate has a multilayer structure, it may contain any desired number of internal conductors, hence a number large enough to provide all necessary connections to the electroluminescent element(s).

By combining an LTCC cover plate with a PolyLED device, a hermetic metal seal can be formed between the LTCC and the glass plate by soldering, which seal surrounds and encloses the active part of the device. A desiccant in the device is not needed in most cases. No electrodes have to pass the through sealing. The interconnect from the electrodes of the active part of the device to the vias (electrical through connectors) of the LTCC may alternatively be manufactured by soldering, or, for example, by ACF (anisotropic conductive foil) or a conductive epoxy. Within the LTCC the highly conductive lines may run in any directions, interconnects can be formed, and even functions of passive components, such as capacitors, inductors, or resistors, can be integrated. A bond-pattern for the IC may be placed in any location as desired.

This combination results in a very thin, flat module of unparalleled reliability. The additional cost of the LTCC is compensated by leaving out expansive interconnect foils, less packaging, and more integrated functions.

In a suitable embodiment at least two internal conductors extend in the cover plate, each one interconnecting a first contact pad to a second contact pad that is not in alignment with the first contact pad. In this embodiment, the internal conductors not only extend substantially perpendicular to the first side of the cover plate, but also laterally. This has the advantage that the position of the contact pads can be chosen as desired. In a further embodiment hereof, the at least two internal conductors each have a portion extending substantially parallel to one of the sides of the cover plate. The portions extending substantially parallel may be arranged at a plurality of different levels inside the cover plate. This provides further flexibility, that is further increased in an embodiment in which the sequence in which the first contact pads, particularly those of the electroluminescent element(s), are connected, differs from the sequence in which the second contact pads are connected to external circuitry.

The electroluminescent element can be present both on the transparent substrate and on the cover plate. In a first embodiment the electroluminescent element is present on the transparent substrate, and provided with an electrode pattern of anode and cathode that is interconnected to the first contact pads in the first conductive pattern on the first side of the cover plate. This has the advantage that the electroluminescent element can be applied on the glass substrate according to usual processing, with first the ITO and finally the various metals. However, it is certainly not excluded to provide the electroluminescent element on the cover plate. This has the advantage that there is no need for an interconnection of the first contact pads to the electroluminescent element, i.e. the contact pads will form part of the electrode pattern.

It is suitable that the electrode pattern of anode and cathode comprises contact pads, which are interconnected to the first contact pads by means of a solder connection. Such a solder connection allows that the interconnection is not limited to the side faces of the cavity formed by cover plate and transparent substrate. Further on, in this manner there is no influence on the sealing means.

It is highly suitable that the intermediate sealing means comprises a solderable metal and that the sealing means and the solder connection being soldered in one process step. Not only does this provide ease of manufacture, but also will the sealing means and the contact pads become automatically aligned during said process step. Alternatively, the intermediate sealing means may comprise other materials. For instance in the case that the transparent substrate comprises glass, the sealing means may be a siloxane material or the like, with which the glass-ceramic material of the cover plate and the glass material of the transparent substrate can be bonded to an integral structure.

In a further embodiment, the pitch of the contact pads of the electrode pattern can be larger than the pitch of at least some of the second contact pads, so that external circuitry, particularly driver ICs, capacitors and the like, having a small pitch can be directly bonded to the second contact pads.

The use of a cover plate with internal conductors further provides very much flexibility with respect to space requirements. The cover plate can for instance be provided with its second side on a printed circuit board, but equally well with its first side. This depends on the location of the second contact pads.

In a advantageous embodiment, a driver circuit is present at one of the sides of the cover plate, which is connected to second contact pads of the second conductive pattern. The advantage of the use of an substrate with internal conductors together with a driver circuit, is that the position of the driver circuit can be freely selected: on the first side, or on the second side. It is further possible to provide the multilayer substrate with a cavity, wherein the driver circuit can be assembled. Such a cavity provides a good mechanical protection for the driver circuit. Further on, the cavity may function as boundary of an encapsulation to be applied on the driver circuit. In a very suitable embodiment, the cover plate is provided with at least two cavities, one for the driver circuit and one for the electroluminescent element. The transparent substrate can then be provided as a flat plate. Further on, this transparent substrate could act as cover for the cavity with the driver circuit as well, leading to a block-wise module. This further allows to separate the individual devices only after the assembly.

These and other aspect of the invention will be apparent from and elucidated with reference to the embodiments described hereinafter.

Figure 2:
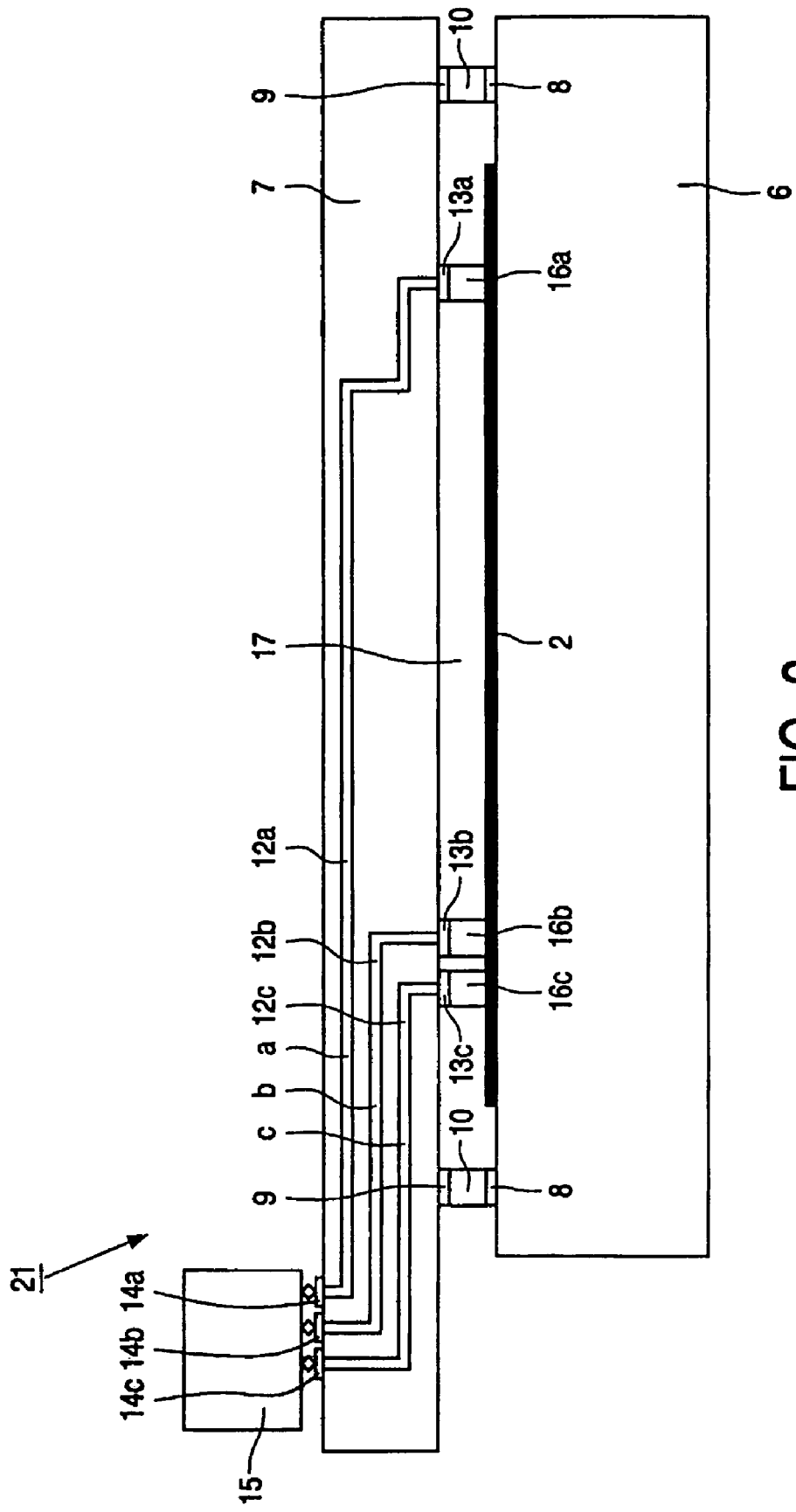
Figure 3:
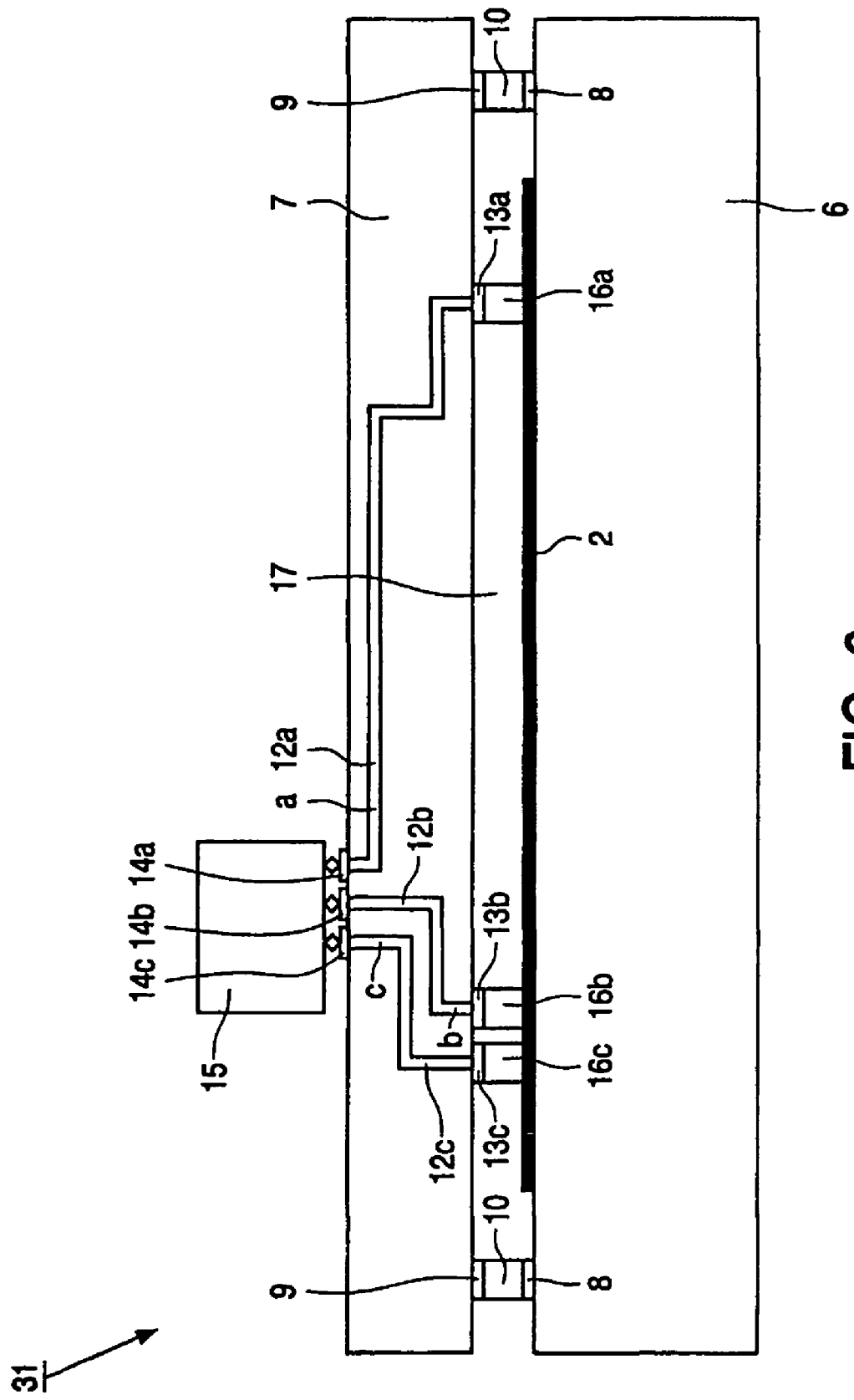

In the drawings:

FIG. 1 is a schematic, cross-sectional view of a first embodiment of the EL device in accordance with the invention, FIG. 2 is a schematic, cross-sectional view of a second embodiment of the EL device in accordance with the invention, FIG. 3 is a schematic, cross-sectional view of the third embodiment of an EL device in accordance with the invention, taken on the line I-I in FIG. 2

EMBODIMENT 1

FIG. 1 is a schematic, cross-sectional view of a first embodiment of an EL device 1 in accordance with the invention. For the sake of clarity, the present and subsequent drawings are not drawn to scale and some parts have been drawn on an enlarged scale relative to others. The EL device 1 comprises an EL element 2. The EL element 2 comprises an electroluminescent organic layer 4 disposed between a hole-injecting electrode 3, which is transparent to the light to be emitted, and an electron-injecting electrode 5. The EL element 2 is enclosed by an airtight and waterproof housing which is formed by the parts 6 through 10. The housing comprises a first shaped part in the form of a glass plate 6 which is transparent to the light to be emitted. The EL element 2 is mounted on the plate 6, which thus serves as a substrate for the EL element 2. The housing further comprises a second shaped part in the form of a coverplate 7. The plates 6 and 7 are connected to each other by means of a closed ring of a low-melting metal alloy 10 so as to seal off the airtight and waterproof housing hermetically. The closed ring of solder 10 is joined to the plate 6 via an electrically conducting, bonding layer 8 in the form of a closed ring whose the shape is identical to that of closed ring 10. Similarly, the closed ring of solder 10 is joined to the plate 7 via a bonding layer 9 in the form of a closed ring whose shape is identical to that of the closed ring 10.

An internal conductor 12a in the form of a metal (for example Cu or Ag) strip extends through the cover plate 7 and connects a first contact pad 13a to a nonaligned second contact pad 14a. In an analogous manner, internal conductor 12b connects first contact pad 13b to a non-aligned second contact pad 14b, and internal conductor 12c connects first contact pad 13c to nonaligned second contact pad 14c. In this embodiment the first contact pads 13a, 13b, 13c . . . and second contact pads 14a, 14b, 14c . . . are arranged on the same side of the cover plate 7, which is the side facing the transparent substrate 6. A driver IC 15 is directly bonded to the second contact pads 14a, 14b, 14c . . . . As the driver IC is mounted on a portion of the cover plate which extends beyond the transparent substrate 6, and on the "lower" side of the cover plate, the device 1 shown in FIG. 1 is very flat.

The first contact pads 13a, 13b, 13c . . . are electrically connected to interconnects 16a, 16b, 16c . . . (which may be, for example, in the form of solder bumps) of the electrode pattern of EL device 2.

The internal conductors 12a, 12b, 12c . . . have respective portions a, b, c . . . which extend substantially parallel to the (main) sides of the cover plate 7. A gas-filled clearance 17 is present between EL element 2 and cover plate 7.

FIG. 2 is a schematic, cross-sectional view of a second embodiment of an EL-device 21 according to the invention. The ELdevice 21 is similar to that of the first embodiment, identical items being identified with identical reference numerals, but differs in that driver IC 15 is (directly) bonded to the "upper" side of cover plate 7, which is the side remote from the transparent substrate 6. The arrangement is such that the driver IC 15 is outside the area bounded by the intermediate sealing means 8, 9, 10. In this case the internal conductors 12a, 12b, 12c . . . connect first contact pads 13a, 13b, 13c . . . on the lower side of the cover plate 7 to nonaligned second contact pads 14a, 14b, 14c on the upper side of the cover plate 7.

FIG. 3 is a schematic, cross-sectional view of a third embodiment of an ELdevice 31 according to the invention. The ELdevice 31 is similar to that of the first embodiment, identical items being identified with identical reference numerals, but differs in that at the "upper" side of cover plate 7, which is the side remote from the transparent substrate 6, a driver IC 15 is provided. The arrangement is such that the driver IC 15 is inside the area bounded by the intermediate sealing means 8, 9, 10. In this case the internal conductors 12a, 12b, 12c . . . connect first contact pads 13a, 13b, 13c . . . on the lower side of the cover plate 7 with non-aligned second contact pads 14a, 14b, 14c . . . on the upper side.

By way of example, the EL device 1 is manufactured as follows:

1. Processing of the Transparent Plate Part:

A glass plate 6 of dimensions 64×64×1 mm provided with a 150 nm thick layer of indium tin oxide so as to form a hole-injecting electrode 3 and the section 11 (supplier Balzers) is cleaned with soapy water and isopropanol in that order. An approximately 150 nm thick organic EL layer 4 is provided by spin-coating from a 0.6 wt. % solution of poly{2-methoxy-5-(2,7-dimethyloctyloxy)-1,4-phenylenevinylene}, synthesized in toluene in accordance with the method described in Braun et. al., Synth. Met., 66(1994), 75. The EL material is removed along the edges by means of a cotton bud and/or a razor blade. In mass-production, laser ablation is a particularly preferred method of removing the superfluous EL material. Yb is vacuum-deposited, via a mask, thereby forming a 200 nm thick electron-injecting electrode 5. The EL element 2 is now complete and is mounted on the first glass plate 6. Using a mask, an approximately 200 nm thick layer of nickel and a 200 mm thick layer of silver are successively provided by means of magnetronsputtering and vapordeposition, respectively, thereby forming the patterned bonding layer 8 in the shape of a first closed ring. The bonding layer 8, which is only a few hundred nm thick, may alternatively be provided prior to the EL layer without adversely affecting the spin-coating process.

2. Processing of the Cover Plate Part:

The cover plate 7 is formed from a ceramic or a glass-ceramic material. Certain LTCC types comprise, for example, ceramic particles which are embedded in a glass phase. Other types comprise crystallized glass. Certain HTCC types (high-temperature co-fired ceramics) comprise, for example, pure ceramic materials.

LTCC tape systems are composed of glass-ceramic dielectric tape provided with shrinkage-matched metallization pastes. Unlike thick film technology, where sequential printing, drying, and firing of each layer is required, LTCC technology, like PW B technology, processes all the different layers in parallel (i.e. all layers are punched, printed, and dried in parallel). Once all the layers have been processed, they are stacked, laminated, and co-fired at temperatures between 800 and 900° C. to form a high-density, fully integrated substrate.

Using the same method and materials as for the application of the bonding layer 8, the cover plate 7 with its internal conductor structure is provided with a patterned bonding layer 9 in the form of a closed ring which is mated to the first closed ring present on plate 6. The resulting plate is dipped in a bath containing the low-melting metal alloy Sn(50 wt. %)Pb (32 wt. %)Cd(18 wt. %) (supplier Witmetaal B. V.), melting point 145° C., kept in the liquid state at 155° C. Upon removal of the plate from the bath, only the bonding layer 9 has been provided with the solder, thereby forming a second closed ring which is mated to the first closed ring present on plate 6.

Solder may be deposited on the first contact pads 13*a*, 13*b*, 13*c* . . . as well.

3. Connecting the Plates:

The processed plates 6 and 7 are placed on a hot platform kept at 155° C., which causes the low-melting metal alloy to melt. The plates 6 and 7 are then joined by mating the first and the second closed ring. It is sufficient to put the first plate on top of the second closed ring. The self-aligning property of the molten low-melting metal alloy then pulls the two closed rings into their final positions of maximum overlap while at the same time the electric interconnections between the EL element and the cover plate are brought into contact with each other. Upon cooling down, the closed ring 10 solidifies so as to form an airtight and waterproof housing which encloses the EL element 2. Since the closed ring 10 is 200 micrometers thick, a clearance 17 is present between the EL element 2 and the plate 7, which clearance is filled with dry nitrogen gas because the joining of the plates 6 and 7 is performed in a dry nitrogen atmosphere.

Alternatively, a solder paste can be directly (screen) printed onto the lower surface of the cover plate 7. After joining of the substrate 6 and the cover plate 7, the assembly is heated up to the softening point of the solder paste (which is preferably below 120° C.) and cooled down. The patterns on the substrate 6 and the cover plate 7 automatically align themselves owing to the softened solder.

Summarizing, the invention relates to an organic electroluminescent device comprising an EL element supported on a transparent substrate. A cover plate of a ceramic or glass-ceramic material is provided, which is sealed to the transparent substrate by metallic sealing means, whereby a gas-tight enclosure is formed for the EL element. The cover plate supports a driver IC. The cover plate is provided with internal conductors which connect first contact pads, which are connected to the EL element, and second contact pads, which are connected to the driver IC, at least one first contact pad and the second contact pad to which it is connected being not in mutual alignment.

The invention claimed is:

1. An organic electroluminescent device comprising:
    a transparent substrate;
    a cover plate that includes a first side facing the transparent substrate, a second side opposed to the first side, and multiple layers between the first and second sides;
    at least one electroluminescent element comprising an organic electroluminescent layer arranged between the transparent substrate and the cover plate; and
    a seal that is configured to join the transparent substrate and the cover plate, wherein:
    the cover plate includes a material selected from the group of glass-ceramic and ceramic materials,
    a first conductive pattern is formed on the first side of the cover plate and includes first contact pads,
    a second conductive pattern is formed on one of the sides of the cover plate and includes second contact pads;
    the first and the second conductive patterns are electrically interconnected via conductors, each conductor extending on at least one internal surface of the multiple layers inside the cover plate,
    the electroluminescent element is present on the transparent substrate, and is provided with an electrode pattern of anode and cathode that is interconnected to the first contact pads in the first conductive pattern on the first side of the cover plate,
    the electrode pattern of anode and cathode comprises contact pads, which are interconnected to the first contact pads by means of a solder connection, and
    the seal means comprises a solderable metal, the seal and the solder connection being soldered in one process step.

2. The device of claim 1, wherein at least two internal conductors extend in the cover plate, each one interconnecting a first contact pad to a second contact pad that is not in alignment with the first contact pad.

3. The device of claim 2, wherein the at least two internal conductors have a portion extending substantially parallel to one of the sides of the cover plate.

4. The device of claim 1, wherein at least some of the first contact pads have a pitch that is greater than the pitch of at least some of the second contact pads.

5. The device of claim 1, wherein a driver circuit is present at one of the sides of the cover plate, which is connected to second contact pads of the second conductive pattern.

6. The device of claim 5, wherein the driver circuit is arranged at the first side of the cover plate.

7. The device of claim 1, wherein the cover plate is formed by means of a co-firing technique.

\* \* \* \* \*